（12）United States Patent
Bull

(10) Patent No.: US 8,319,518 B2
(45) Date of Patent: Nov. 27, 2012

(54) DETECTING TRANSITIONS IN CIRCUITS DURING PERIODIC DETECTION WINDOWS

(75) Inventor: David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 403 days.

(21) Appl. No.: 12/591,436

(22) Filed: Nov. 19, 2009

(65) Prior Publication Data

US 2010/0134148 A1 Jun. 3, 2010

(30) Foreign Application Priority Data

Dec. 2, 2008 (GB) .................................. 0822003.0

(51) Int. Cl.
*H03K 19/003* (2006.01)

(52) U.S. Cl. .................... 326/9; 326/14; 326/16; 326/93

(58) Field of Classification Search ........................ None
See application file for complete search history.

(56) References Cited

U.S. PATENT DOCUMENTS

| | | | |
|---|---|---|---|
| 6,108,794 A | 8/2000 | Erickson | |
| 6,404,233 B1 | 6/2002 | Blomgren et al. | |
| 6,768,333 B1 | 7/2004 | Kao et al. | |
| 7,617,409 B2 * | 11/2009 | Gilday et al. | 713/503 |
| 2005/0220236 A1 * | 10/2005 | Wood | 375/355 |

FOREIGN PATENT DOCUMENTS

| | | |
|---|---|---|
| GB | 2 432 009 | 5/2007 |
| WO | WO 99/17183 | 4/1999 |
| WO | WO 2008/096303 | 8/2008 |

OTHER PUBLICATIONS

Search Report for UK 0822003.0 dated Mar. 5, 2009.

* cited by examiner

*Primary Examiner* — Anh Tran
(74) *Attorney, Agent, or Firm* — Nixon & Vanderhye P.C.

(57) ABSTRACT

Transition detection circuitry for detecting during multiple clock cycles, transitions occurring within a detection period in each of said multiple clock cycles at a plurality of nodes within a circuit is disclosed. The transition detection circuitry comprises: a clock signal generator for generating a detection clock signal from a clock signal clocking a sampling element within said circuit, said detection clock signal defining said detection period; a plurality of transition detectors for detecting transitions at respective ones of said plurality of nodes during said detection period, each of said plurality of transition detectors being clocked by said detection clock signal; and combining circuitry for combining said detected transitions output by said plurality of transition detectors to generate a composite transition detection signal.

21 Claims, 10 Drawing Sheets

DETECTING TRANSITIONS IN CIRCUITS DURING PERIODIC DETECTION WINDOWS

This application claims priority to GB Application No. 0822003.0, filed Dec. 2, 2008, the entire contents of which are hereby incorporated by reference.

BACKGROUND OF THE INVENTION

1. Field of the Invention

The field of the invention relates to data processing and in particular to detecting transitions occurring at nodes within a circuit.

2. Description of the Prior Art

The present invention is concerned with circuits which have clocked latches or registers for receiving, storing and outputting signals, the latches being connected together by combinational logic. The signals take a finite amount of time to pass through the combinational logic, and the clocking frequency of the latches must not be so high that a signal cannot pass through the connecting combinational logic and reach a next latch within the clock cycle. If the clocking frequency is too high errors will occur.

The time taken for a signal to pass through the combinational logic is affected by a number of things such as operational voltage and temperature of the circuit. Thus, when determining an appropriate clocking frequency, different factors such as the expected operating conditions of the circuit and the tolerance of the device to occasional errors need to be considered.

Previously when determining what a suitable operational frequency of a circuit might be, synthetic circuits have been created which replicate the circuit under question. These synthetic circuits are designed so that the timing can be easily observed, and they try to imitate the delay dependencies of the circuit they are mimicking. Example signals are run and the real circuit is calibrated against them. An alternative has been to identify the critical paths of the real circuit and to build delay/parametric circuits that attempt to match these paths. Precise matching of circuits and paths is becoming harder and harder as these get smaller due to localised variation and parasitic noise effects caused by neighbouring elements. There are also delays due to parasitic noise in system elements such as clock trees or power girds and these are not deterministic.

It would be desirable to be able to accurately determine a suitable operating frequency of a circuit.

SUMMARY OF THE INVENTION

A first aspect of the present invention provides transition detection circuitry for detecting during multiple clock cycles, transitions occurring within a detection period in each of said multiple clock cycles at a plurality of nodes within a circuit, said transition detection circuitry comprising: a clock signal generator for generating a detection clock signal from a clock signal clocking a sampling element within said circuit, said detection clock signal defining said detection period; a plurality of transition detectors for detecting transitions at respective ones of said plurality of nodes during said detection period, each of said plurality of transition detectors being clocked by said detection clock signal; combining circuitry for combining said detected transitions output by said plurality of transition detectors to generate a composite transition detection signal.

The present invention recognises that replica circuits do not necessarily have the same delays as the circuits they are imitating. Thus, rather than measuring the slack of a system using replica circuits, the present invention actually monitors the circuits themselves by providing transition detectors for detecting transitions at active nodes. In-situ monitoring allows the actual transitions that occur within the circuit to be detected. Furthermore, the transition detectors can be inserted into the design after physical placement of other logic and there is no need to create a critical path replica at an early stage in the design flow. Additionally such a set up can be used in systems where the worst case paths are not known, with the transition detectors being placed at different nodes to determine empirically how the circuit acts.

In some embodiments, said clock signal generator generates said detection clock signal by inverting said clock signal clocking said sampling element and delaying an edge initiating said detection period.

The detection clock signal can be generated in a number of ways but it may be generated by simply inverting the clock signal that is clocking the sampling element and delaying the edge that initiates the detection period. In this way, a detection period that is delayed with respect to the clock signal is generated and the amount of delay that is added to this clock signal can be adjusted depending on the position in the circuit that is being detected and the margin required.

In some embodiments, said clock signal generator generates said detection clock signal by delaying said clock signal by an amount such that a time delay from said detection clock signal transitioning to start said detection period and a subsequent transition of said clock signal is greater than a time taken for a signal from any of said plurality of nodes to reach said sampling element.

The time delay from the rising edge of the detection clock to the rising edge of the sampling clock should be greater than the time taken for a signal for any of the nodes to reach the sampling element. If the delay is less than this then a transition may still not be safe and yet may not be detected as it may not occur within this detection period.

In some embodiments, said plurality of nodes are located upstream from said sampling element by at least one combinational logic element.

Embodiments of the present invention are concerned with the delay through the combinational logic. By measuring transitions occurring within this logic during a clock cycle, their relative position in the clock cycle (determined by the detection period) and their relative position in the combination logic (determined by the position of the node) can be used to determine if they are safe or not. Thus, nodes are selected within the logic, not at the sampling element itself and the detection period for detecting if transitions are safe or not is within the clock cycle at a place dependent on the position of the node.

The sampling element may comprise a number of things, but in some embodiments it comprises a latch. A latch is an element that samples a signal in response to a clock; it may be an element within a RAM or it may be a register, flip-flop or clock gating cell.

In some embodiments said transition detection circuitry further comprises control circuitry, said control circuitry being responsive to said composite transition detection signal to control one or more operational parameters of said circuit, said one or more operational parameters including one or more of an operating voltage and an operating frequency.

In addition to circuitry for detecting transitions in some embodiments the circuitry comprises control circuitry for controlling operational parameters of the circuit it is detecting to try to influence when the transitions occur.

In some embodiments, said control circuitry is responsive to said composite transition detection signal indicating more detected transitions than a predetermined value to perform at least one of the following steps: increase said operating voltage and decrease said operating frequency.

In some embodiments, in response to detecting more late transitions than is considered desirable the control circuitry may increase the operating voltage or decrease the operating frequency to try to reduce the number of late transitions.

In some embodiments, said transition detection circuitry further comprises control circuitry, said control circuitry being configured to control said clock signal generator to change said detection clock signal such that said detection period occurs at a different time within said clock cycle in response to detection of an externally set control parameter.

The point of time that a detection period occurs in the clock cycle can be changed in response to different things. For example, in response to an externally set control parameter. This control parameter may be a signal from a system indicating that this system is now operating in a mode where more or fewer errors are tolerated, or it may be a user input indicating that the required accuracy has changed. In response to this the detection period can be moved within the clock cycle, for example it could be moved so that only very late transitions are detected.

In some embodiments, said transition detection circuitry further comprises control circuitry, said control circuitry being configured to periodically turn said clock signal generator off, such that said detection clock signal is generated intermittently.

Although in some instances it may be advantageous to constantly monitor the circuit for transitions, it may be that at some points the circuit is not particularly active and it is not important to monitor it, or it may be that it is decided that only periodic monitoring of the system is needed as the conditions of the system are not expected to change quickly. The things that may affect operation of the system may for example be temperature which changes slowly and if this is the parameter that is expected to affect the operation of the system then transitions only need to be monitored intermittently. Thus, in such circumstances it is advantageous to turn the clock signal generator off periodically and thereby save power.

In some embodiments, said control circuitry is responsive to said transition detection circuitry detecting fewer than a predetermined number of transitions within a predetermined time to turn said clock signal generator off.

It may be that certain portions of the circuit are not active at certain times. If they are not active then there is not much point in powering the clock signal generator. Inactivity in the circuit can be detected using the transition detections themselves and if fewer transitions than a certain number are detected during a predetermined time then the clock signal generator can be turned off and no detection clock signal generated to clock the transition detectors.

In some embodiments, said clock signal generator is turned off with said clock signal having a value such that said transition detectors continue to detect transitions, said control circuitry being responsive to detection of a transition by one of said transition detectors to turn said clock signal generator on.

It may be advantageous to turn the clock signal generator off with the clock signal having a value so that the transition detectors continue to detect transitions. This can then be used as a mechanism to turn the clock signal generator back on when transitions are once again detected indicating that this portion of the circuit is now active again.

In some embodiments, said combining circuitry combines said detected transitions to generate a binary signal indicating a detection of at least one transition or a detection of no transitions.

The combining circuitry can combine the detected transitions to generate a detection signal in a number of ways. It may generate a simple binary signal indicating transitions have been detected or they have not. This may be interesting in safety critical situations where it is important that no late transitions occur and thus the detection of any transition is important. In other embodiments, it may be that a certain number of transitions are allowed and a more statistical approach is required with more details being provided of the number and frequency of the transitions occurring. In such cases, the combining circuitry will combine the detected transition to generate a signal which perhaps indicates the number of transitions occurring within a predetermined time or perhaps indicates different statistical information.

In some embodiments, said clock signal generator is configured to generate a plurality of detection clock signals from a clock signal clocking said sampling element, each of said detection clock signals defining a different detection period within said clock cycle; and wherein said plurality of transition detectors are for detecting transitions at respective ones of said plurality of nodes of said circuit, said plurality of nodes being arranged at different points within said circuit and at different distances from said sampling element, said nodes being arranged in sets corresponding to their distance from said sampling element, each set comprising nodes at a similar distance from said sampling element, at least some of said transition detectors being clocked by a different one of said detection clock signals; and said combining circuitry is configured to combine detected transitions output by transition detectors detecting transitions at each set of nodes, such that a combined transition detection signal is generated for each set of nodes.

It may be that the transition detectors detect many different nodes within the circuit and that different detection periods are used for at least some of these nodes. In such a case, a clock signal generator may generate a plurality of detection clock signals providing different detection periods or there may be a plurality of clock signal generators each generating different detection clock signals. The combining circuitry can combine the detected transitions in a number of ways, for example they can be combined for each set of nodes or they can be combined in a different way. Furthermore, the same detection clock signals could be provided to all transition detectors detecting a particular set of nodes or alternatively a set of nodes could be detected using transition detectors clocked by different detection clock signals. This latter example could be used to provide more detailed information on how late transitions occur at a particular node.

In some embodiments, said circuit comprises a plurality of sampling elements with combinational logic between said sampling elements, and wherein said plurality of transition detectors are for detecting transitions at respective ones of said plurality of nodes of said circuit, said plurality of nodes being arranged at different points within said circuit between different sampling elements, said nodes being arranged in sets corresponding to said sampling elements that they are between; said combining circuitry being configured to combine said detected transitions output by a plurality of transition detectors detecting transitions at each set of nodes to generate a plurality of composite transition detection signals corresponding to said set of nodes.

In addition to sampling nodes at different distances from one sampling element within a circuit, there may also be several sampling elements and the transition detectors can be used to monitor the combinational logic between the different sampling elements.

In some embodiments, at least some of said transition detectors are configured to detect transitions from a first logic level to a second logic level and not to detect transitions from said second logic level to said first logic level.

Some embodiments of the invention have a statistical approach to detecting transitions and are not concerned with absolute numbers, but are rather concerned that the frequency of transitions is not too large. In such a case it is not important to accurately detect every single transition. Thus, in some embodiments, it may be acceptable to have a transition detector that only detects transitions that transition in one direction. Such transition detectors are generally cheap to build and the loss of accuracy due to not detecting the transitions in the other direction is not important as it is a statistical idea of the number of transitions occurring within a certain time that is required. It may also be that in some embodiments only one transition direction is critical and in such embodiments it clearly makes sense to only detect transitions in this direction.

In some embodiments, at least one of said plurality of transition detectors is configured to detect transitions occurring between a first logic level and a second logic level and said combination circuit element is configured to propagate transitions occurring between closer logic levels than said first and second logic levels, such that some transitions that are propagated by said combination circuit element are not detected by said at least one transition detector.

As discussed above, it may not be important to detect all transitions and thus, the transition detectors may work on a coarser logic level than the combinational circuit that they are monitoring. Thus, it may be that some transitions that are enough to switch the combinational circuit are not detected by the transition detectors. This means that a less accurate and therefore cheaper transition detector can be used.

A further aspect of the present invention provides analytical circuitry for analysing a circuit and determining preferred operating conditions of said circuit comprising: transition detection circuitry for detecting during multiple clock cycles, transitions occurring within a detection period in each of said multiple clock cycles at a plurality of nodes within said circuit, said transition detection circuitry comprising: a clock signal generator for generating a detection clock signal from a clock signal clocking a sampling element within said circuit, said detection clock signal defining said detection period; a plurality of transition detectors for detecting transitions at respective ones of said plurality of nodes during said detection period, each of said plurality of transition detectors being clocked by said detection clock signal; combining circuitry for combining said detected transitions output by said plurality of transition detectors to generate a composite transition detection signal; said analytical circuitry further comprising: control circuitry for controlling at least one of said operational voltage of said circuit and said clock frequency clocking said sampling element; and analysing circuitry for analysing said composite transition detection signals output and for determining a preferred value for at least one of said operational voltage and said clock frequency.

Embodiments of the present invention can be used to analyse a circuit and determine the preferred operational parameters such as operating frequency and operational voltage for this circuit. The circuit can then be configured to operate with these values.

A yet further aspect of the present invention provides a method of detecting during multiple clock cycles, transitions occurring within a detection period during each of said multiple clock cycles at a plurality of nodes within a circuit comprising sampling elements clocked by a clock outputting said multiple clock cycles, said method comprising the steps of: detecting transitions at respective ones of said plurality of nodes during said detection period; combining said detected transitions to generate a composite transition detection signal.

The above, and other objects, features and advantages of this invention will be apparent from the following detailed description of illustrative embodiments which is to be read in connection with the accompanying drawings.

BRIEF DESCRIPTION OF THE DRAWINGS

FIG. 5b shows a timing diagram of FIG. 5a;

DESCRIPTION OF THE PREFERRED EMBODIMENTS

Figure 1:
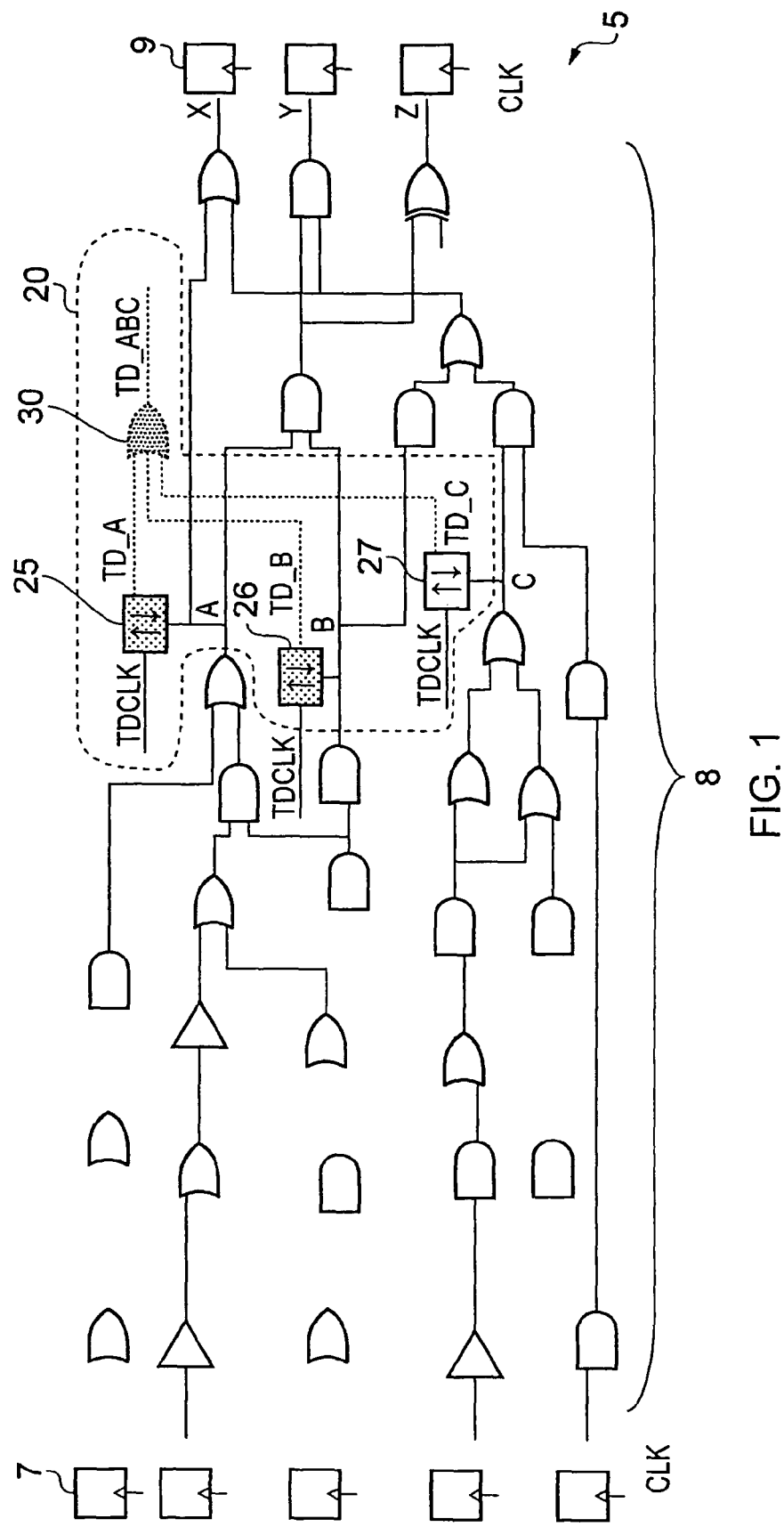
FIG. 1 shows combinational logic within a portion of a circuit being monitored by transition detection circuitry according to an embodiment of the present invention.

FIG. 1 shows transition detection circuitry according to an embodiment of the present invention. Transition detection circuitry 20 detects transitions at nodes A, B and C within combinational logic 8 in circuit 5. Combinational logic 8 connects a set of latches 7 with a set of latches 9 within circuit 5. Transition detection circuitry 20 detects transitions using transition detectors 25, 26 and 27, the transitions detected by these three detectors are then combined using combining circuitry 30 to generate a composite transition detection signal TD_ABC.

Each of transition detectors 25-27 are clocked by TDCLK which is the transition detection clock signal generated from the clock signal CLK that is clocking the latches 7, 9 in circuit 5.

It should be noted with respect to FIG. 1 that nodes A B and C are selected as being high activity nodes where there are expected to be many transitions as this provides more likelihood that late transitions will be spotted. Furthermore, they are chosen so that for a system with sufficient slack all switching activity will have completed before TDCLK rises and the worst case delay from A B or C to the register inputs X Y and Z is such that it can never cause a timing violation. In this respect there should be some margin to guarantee this occurs and this margin can be adjusted by changing the delay between CLK and TDCLK. It should be noted that in many embodiments a relatively large number of nodes (of the order of hundreds) are monitored, depending on the system and the margin used.

Figure 2:
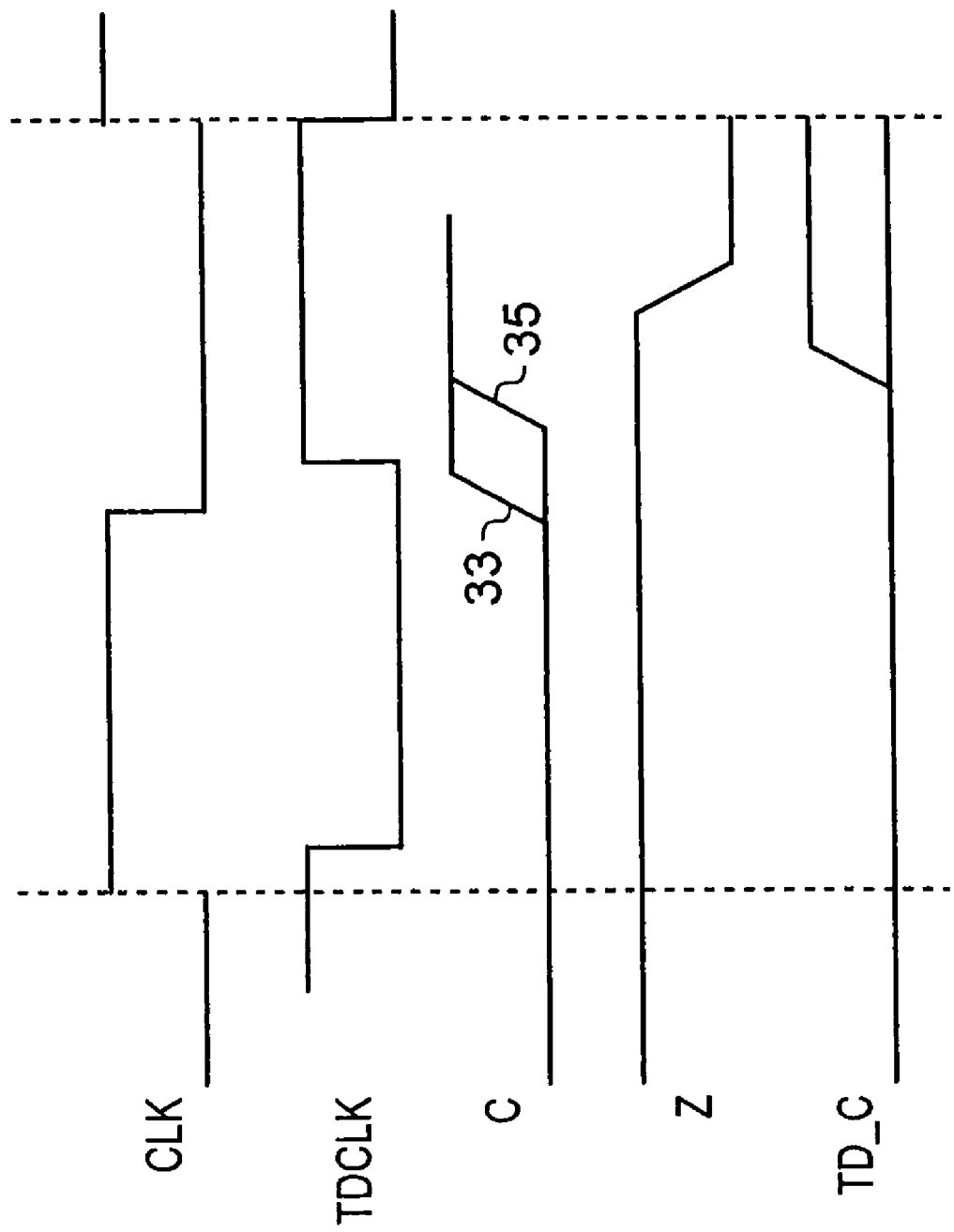
FIG. 2 shows the timing of the circuit of FIG. 1.

TDCLK is generated from CLK by a detection clock signal generator (not shown) that inverts the CLK signal and then delays the rising edge. FIG. 2 is a timing diagram showing the timing relationship between CLK, TDCLK and output Z. As can be seen TDCLK is an inverted version of the clock signal CLK with a delayed rising edge. If node C transitions 33 before the rising edge of TDCLK but is stable when TDCLK is high, no transition is detected. If node C transitions 35 when TDCLK is high however, then transition detect output TD_C is asserted. This indicates that C has been detected transitioning late.

Figure 3:
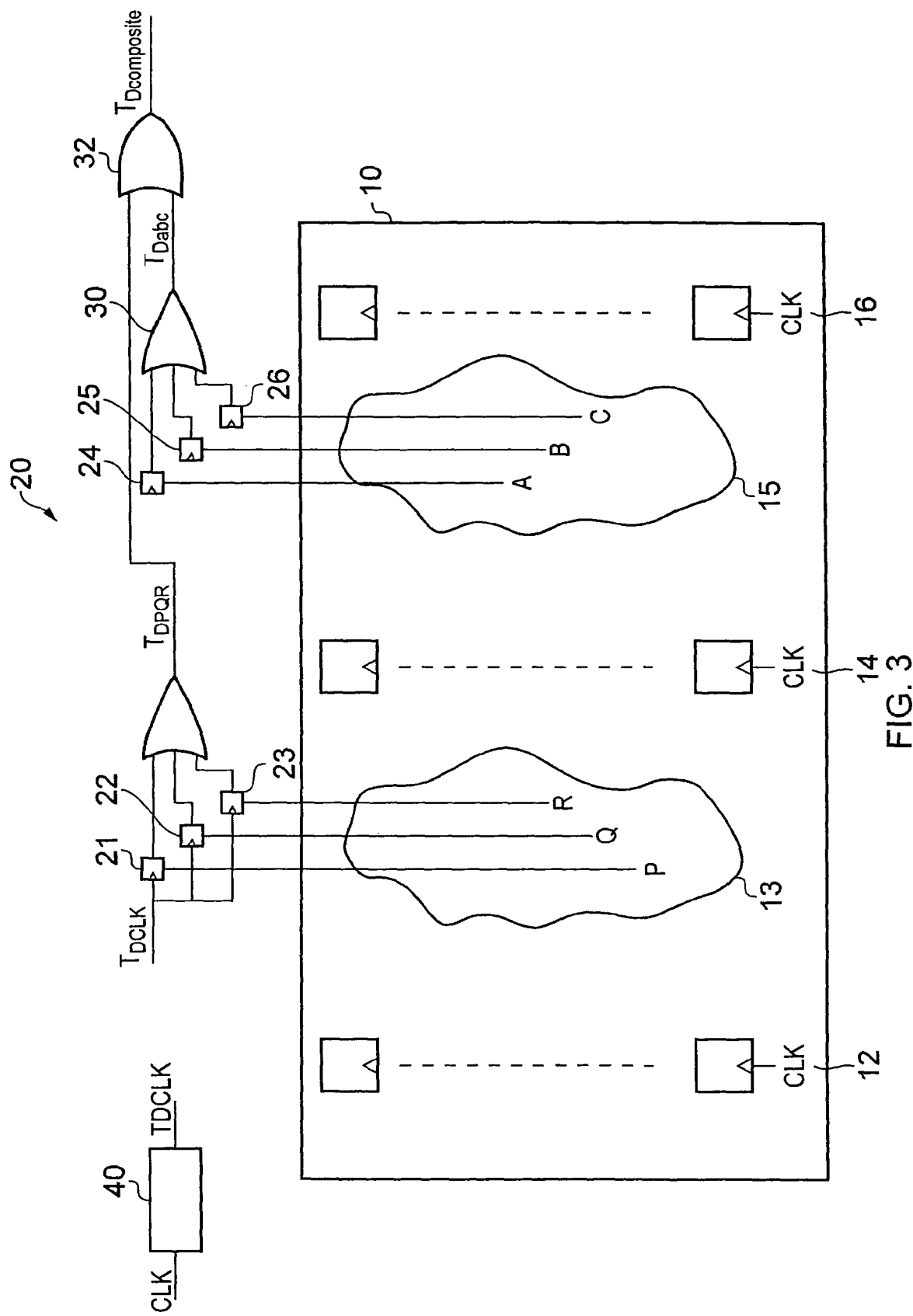
FIG. 3 shows transition detection circuitry according to another embodiment of the present invention.

FIG. 3 shows a circuit 10 that is being monitored by transition detector 20. Circuit 10 comprises several latch stages 12, 14, 16 which are connected by combinational logic shown schematically here as 13 and 15. Transition detection circuitry 20 is made up of individual transition detectors 21, 22, 23, 24, 25, 26 which are set to monitor nodes within combinational logic 13 and 15 respectively. In this example three nodes are detected in each of the two separate combinational logic blocks, transition detectors 21, 22 and 23 detecting nodes P, Q and R within combinational logic 13 while transition detectors 24, 25 and 26 detect nodes A, B and C within combinational logic 15. The detected signals are then combined using combining circuitry 30 which generates a composite signal $TD_{PQR}$ which is a signal indicating the transitions detected at nodes P, Q and R and a composite signal $TD_{ABC}$ for nodes A, B and C. These signals can be output separately and analysed separately or they can be combined as they are in this embodiment by combining circuitry 32 to generate an overall composite detection signal TD composite.

The transition detectors 21-26 are clocked by TDCLK which is the detection clock. This is generated from the clock signal CLK by detection clock signal generator 40.

In this figure there are two blocks of combinational logic that are being monitored to determine if there are any late transitions occurring. The results of this monitoring can be output separately to determine that there is a problem in a certain part of the combinational logic or they can be combined to show that there is a problem in the circuit which can then be addressed by perhaps decreasing the clocking frequency of the circuit or increasing its operational voltage.

FIG. 3 is similar to FIG. 1 except that it comprises additional latch or register stages. As will be appreciated by the skilled person such a circuit may have many latched stages with combinational logic lying between them. Embodiments of the present invention can be used to monitor the combinational logic in all of these stages or in a selected few where it is expected that there may be timing problems.

Figure 4:
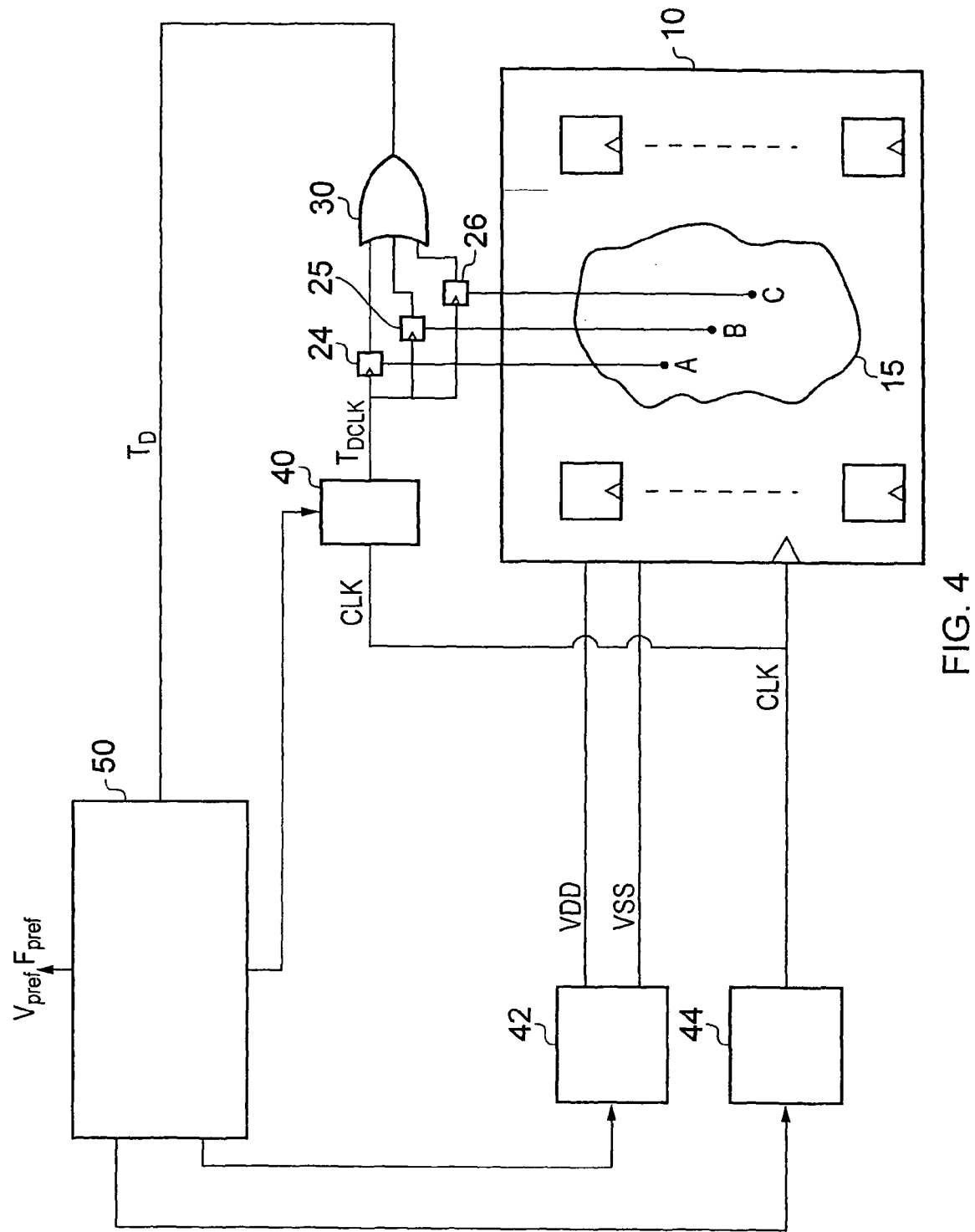
FIG. 4 shows an analysing circuit for analysing transitions within a circuit according to an embodiment of the present invention.

FIG. 4 shows an analysing system according to an embodiment of the present invention. In this system circuit 10 is analysed and nodes A, B and C in combinational logic 15 are monitored by transition detectors 24, 25 and 26 to see if any transitions occur within the time period set by the detection time clock TDCLK. The output of the transition detectors 24-26 are combined by combining circuitry 30 and a composite transition detection signal TD is sent to analysing circuitry 50 which analyses the number of transitions detected and in response to this may change the delay to the detection clock signal generated in detection clock signal generator 40 and/or may change the operational voltage of the circuit supplied from voltage generator 42 and/or the operational clocking frequency supplied from clock signal generator 44. The analysing circuitry 50 sends signals to change these parameters until it finds an operational voltage and operational clocking frequency which provide no or very few late transitions. It then outputs these as the preferred operational voltage and clocking frequency of circuit 10.

It should be noted that the detection clock signal delay can be changed so that initially few transitions are detected and an operational voltage and operational frequency can be selected for this. A smaller delay for the detection clock can then be used to determine a more exact operational frequency and voltage.

Figure 5A:
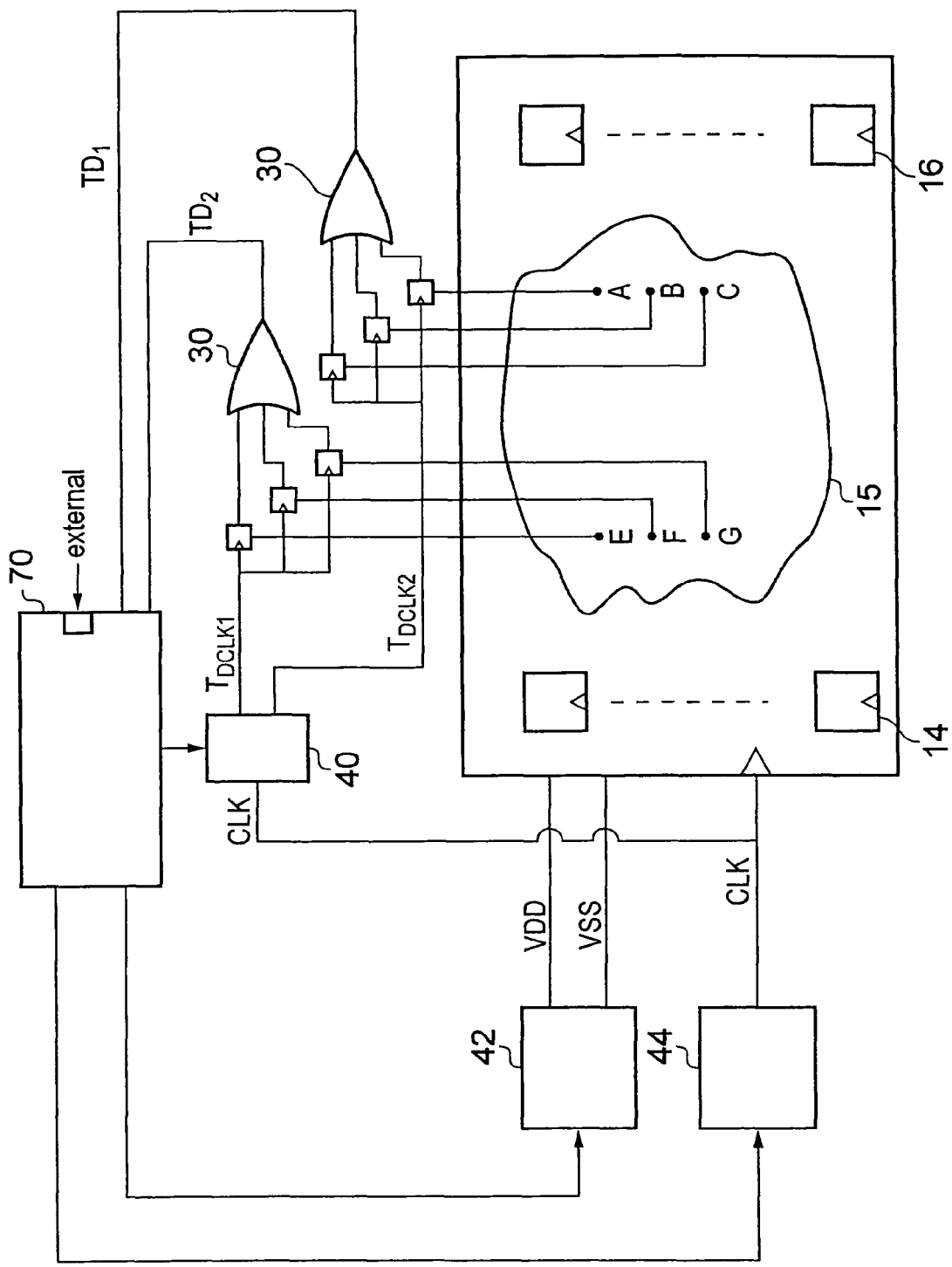
FIG. 5a shows a control circuit for controlling operational voltage and clock frequency of a circuit by monitoring transition.

FIG. 5a shows an alternative embodiment in which circuit 10 being monitored is monitored at two sets of nodes at different places within combinational logic 15. Three of the nodes A, B and C are close to the sampling elements or latches 16 whilst nodes E, F and G are closer to the latches 14. Detection clock signal generator 40 generates two detection clock signals TDCLK1 and TDCLK2.

Figure 5B:
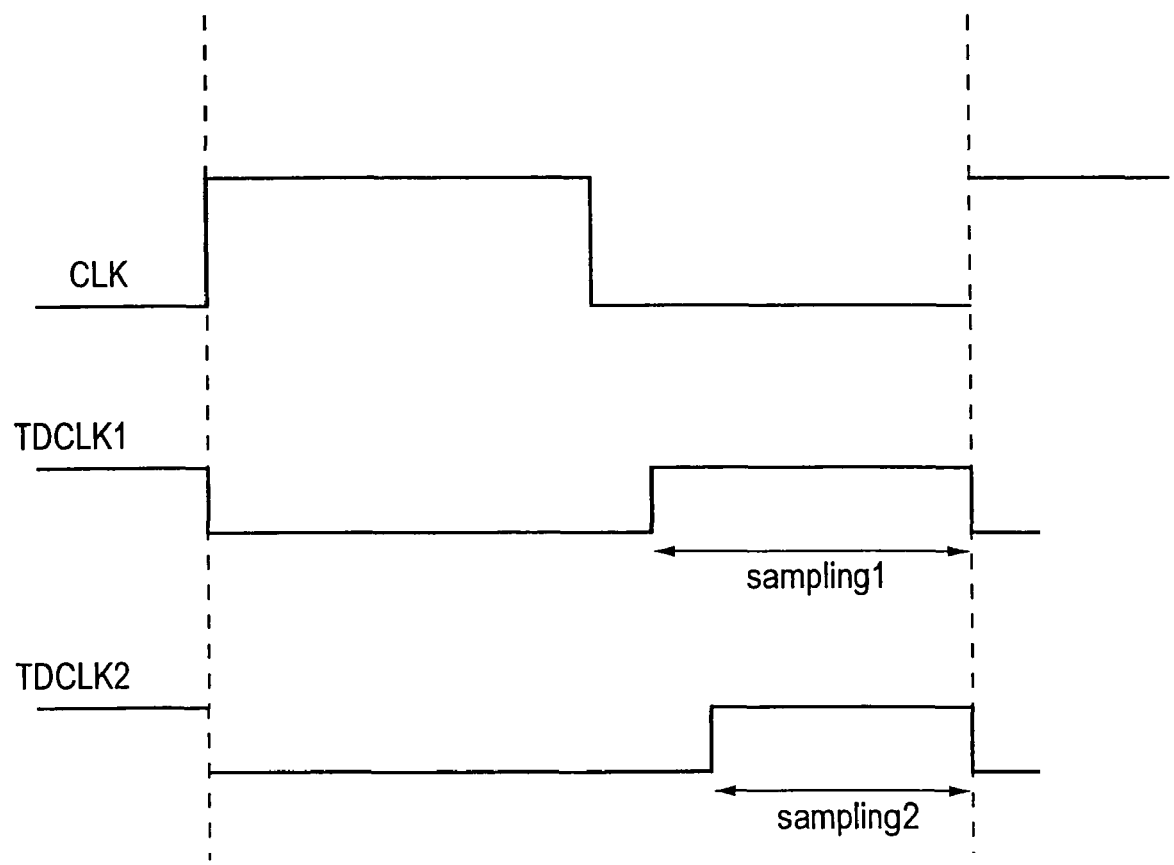

FIG. 5b is a timing diagram showing these signals. As can be seen the delay on TDCLK1 is shorter than the delay for TDCLK2. This is because the time taken for the signal to pass through detection combinational logic 15 to the nodes A, B and C towards the downstream end of this combinational logic is longer than the delay taken for signals to reach nodes E, F and G. Thus, these signals should be detected at a later time.

In this embodiment, control circuitry 70 receives the composite transition detection signals TD1 and TD2 and in response to these varies the operational voltage and the operational frequency of circuit 10. It may also vary the delay of the detection clock signal.

Control circuitry 70 also has an input for receiving an external control signal. This can be sent by a user or it can be sent from a system that circuit 10 is part of. The signal provides information about the mode of operation of the system and whether a high accuracy is required, or whether some errors can be tolerated. If the system is operating in a high quality mode then the number of detected transitions that are tolerated is very low and thus, in response to a low number the clocking frequency is decreased or the operational voltage is increased. In the low quality mode, more errors can be tolerated and thus more transitions can be detected before the operational voltage needs to be increased or the clocking frequency decreased. Alternatively, rather than changing the number of transitions that are tolerated the detection clock signal could be changed so that the delay is moved to a later position in the clocking signal for a low quality mode, or an earlier position for a higher quality mode.

It should be noted that although in this embodiment the transition detectors relating to nodes in a similar position are shown as being clocked by the same clock signal, in some embodiments some of nodes A, B and C for example may be clocked by TDCLK2 while some of them may be clocked by TDCLK1 if it is desirable to firstly have a rough idea from a look at a detection signal with a longer delay if things are fine and then a more accurate idea by looking at a detection signal with a shorter delay to verify this. It may also be that a particular node has a high switching activity and also exhibits close to worst case delay behaviour when switching does occur and thus, such a node is very important to monitor. Thus, in some embodiments this node may be detected using a transition detector clocked by TDCLK2 at first and then by TDCLK1 once the operating frequency and voltage have been adjusted so that no transitions occur under TDCLK2.

Figure 6A:
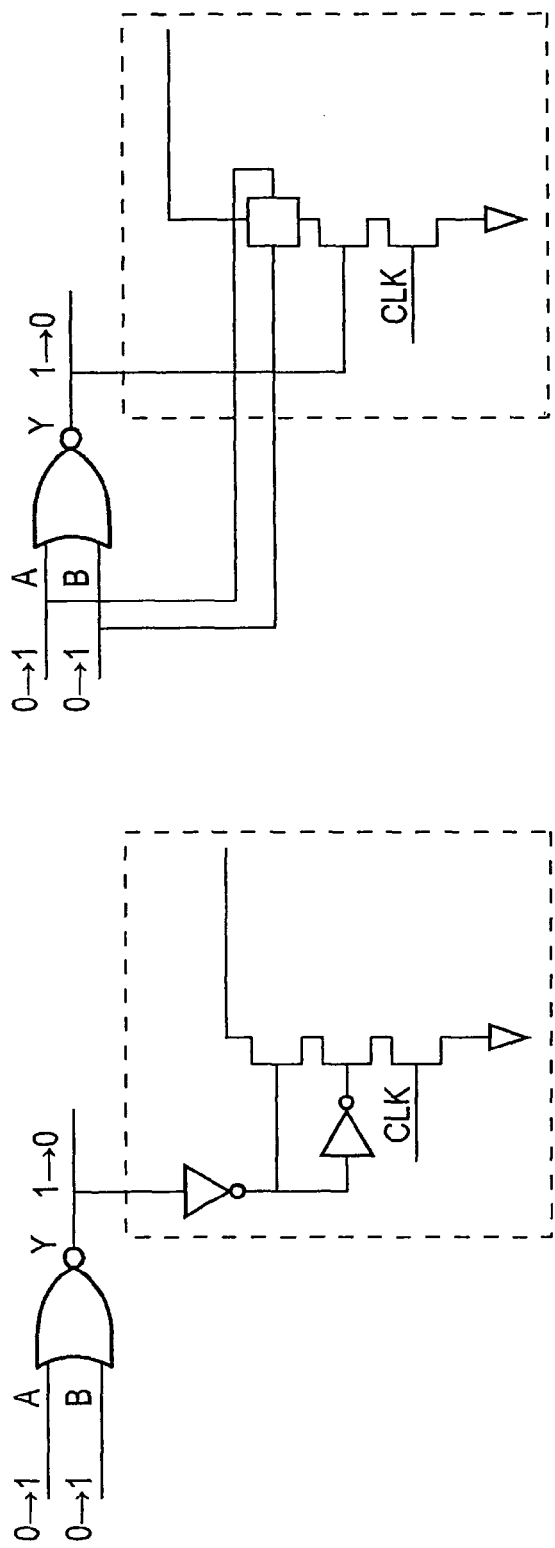
FIG. 6a shows examples of transition detectors.

FIG. 6a shows two examples of transition detectors. Transition detectors traditionally work by comparing a delayed inverted version of a signal with a non-delayed version, triggering a detect signal when these two signals have the same value. If only partial detection of transitions is required then it is possible to reuse the intrinsic delay through gates and reduce the number of additional transitions required at the expense of more interconnect. This is shown in FIG. 6*a* which shows two alternative arrangements for detecting a 1 to 0 transition on the output of a NOR gate. Both examples use the dynamic NAND structure to capture the transition (only pull-down stack is shown). The example on the left shows the arrangement where only the Y node is sampled by the transition detector. The example on the right also uses inputs A and B as well as Y but uses fewer devices.

Figure 6B:
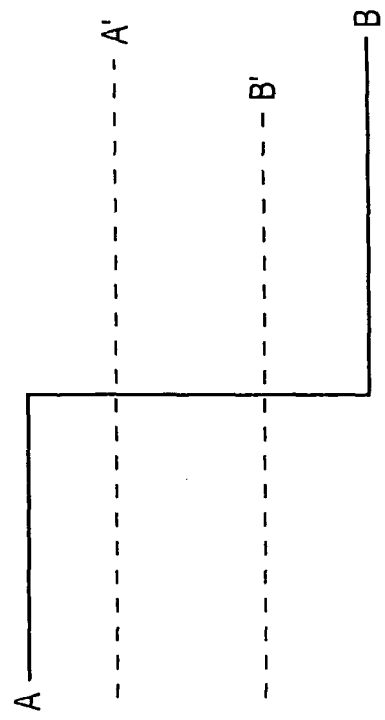
FIG. 6b shows a transition in logic level.

FIG. 6*b* shows schematically two logic levels and a transition between them. Generally circuits are seen as operating with digital values at one of two voltage levels. However, it is clear that in reality there will be some variation in these voltage levels and thus, most circuit elements will operate with levels somewhat below the optimum levels. FIG. 6*b* schematically shows the voltage levels A' and B' that are sufficient to trigger the transition detectors of FIG. 6*a* and the ideal voltage levels A and B that correspond to the supply voltages of the circuit. It may be that combinational logic elements used in the circuit are more sensitive than the transition detectors used and switch on logic levels that lie between A' and B'. In such a case, the transition detectors will not detect all the transitions that can propagate through the combinational logic. This need not be a problem as embodiments of the invention are used in a statistical fashion to provide an approximate idea of the number of transitions occurring. In safety critical circuits where it is important to detect any transitions then transition detectors that are as sensitive or are more sensitive than the combinational logic should be used.

Figure 7:
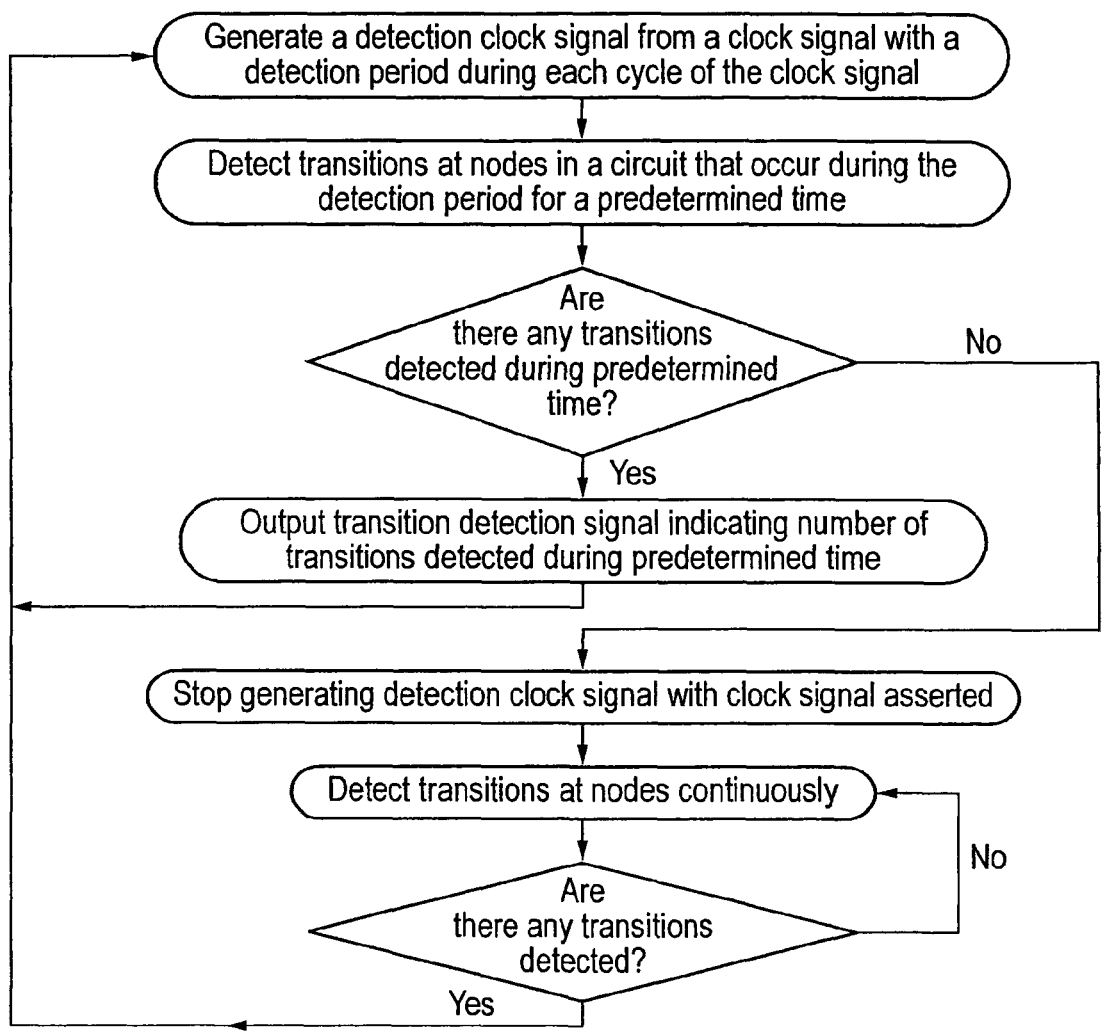
FIG. 7 shows a flow diagram of a method of detecting slack in a system according to an embodiment of the present invention.

FIG. 7 shows a flow diagram indicating an intermittent slack detection method according to an embodiment of the present invention. This method could be used in circuits with intermittent/burst usage profiles, such as decoders for different instruction sets, floating point logic etc. In this embodiment a detection clock signal is generated from a clock signal clocking a circuit being monitored. The detection clock signal is generated to have a detection period during each clock cycle of the clock signal it was generated from. Transitions at nodes within the circuit being monitored are then detected during the detection period over a predetermined time. An analysis is then performed to see if any transitions have been detected during this time. If they have been then the transition detection signal indicating the number that have been detected is output and the system continues to detect transitions during detection periods of the detection clock signal.

If no transition has been detected during this predetermined time then the detection clock signal is stopped in an asserted state and transitions are then continuously detected at the nodes. This is done as if no transitions are detected during this time then it is assumed that this portion of the system has entered a low activity mode and thus, to save power the detection clock signal is turned off as it is not worth generating a detection clock signal for transition detectors that are detecting an inactive node. In this embodiment the detection clock is turned off in an asserted state so that the transition detectors continue to monitor for transitions. They can then be used as a signal to start detecting for transitions again. Thus, if a transition is detected, this indicates that the node is active again and the detection clock is turned back on and detection of the nodes for late transitions that occur during the detection period is resumed.

It should be noted that in this embodiment the transition detector is used to determine if the system is inactive or not. This results in a system that exhibits some inertia and this needs to be factored into the margining decisions used for the system. An alternative to using the transition detectors to start and stop the detection clock signal might be to derive stop or start indication from the logic used to create clock enable signals for sampling latches.

Figure 8:
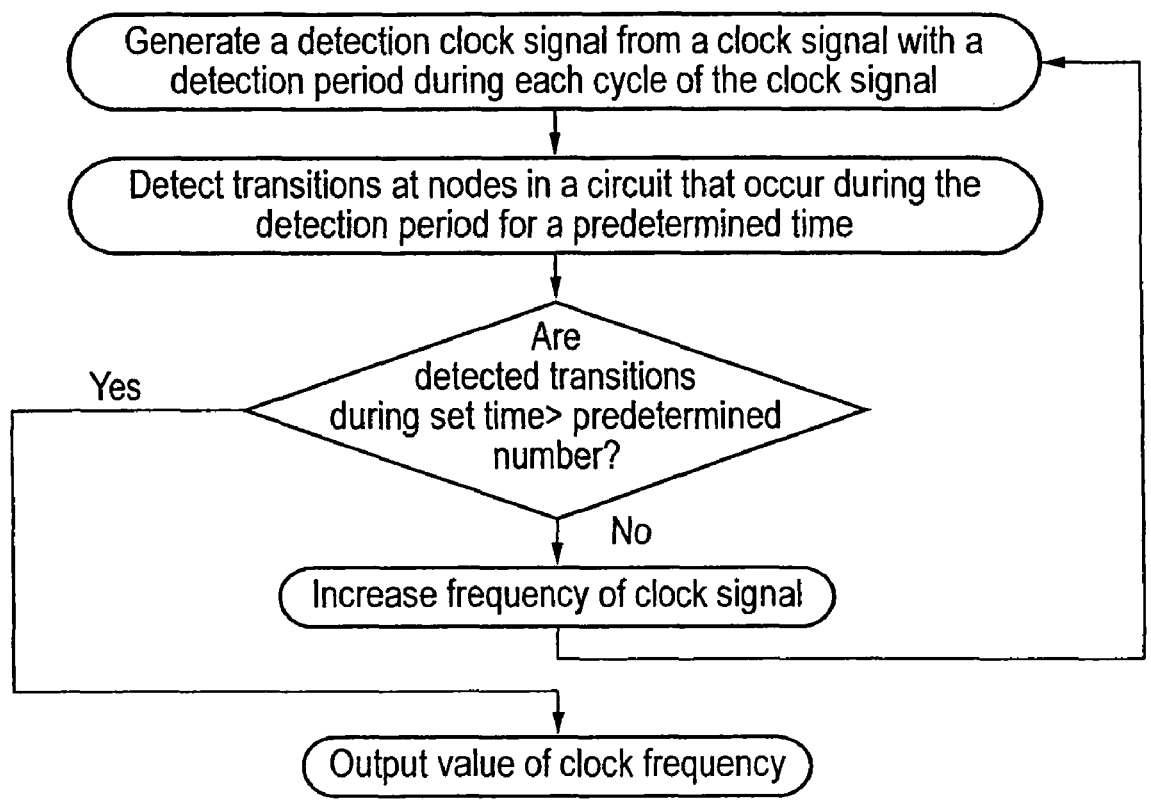
FIG. 8 shows a method of analysing a circuit to determine a preferred value of the clock frequency according to an embodiment of the present invention.

FIG. 8 shows a method of analysing a circuit to find its preferred operating frequency. In this embodiment, a detection clock signal is generated and transitions are detected at a number of nodes in a circuit. An assessment is then made as to whether or not these detected transitions are greater than a predetermined number. If they are not then the frequency of the clock signal is increased and this detection occurs again. If they are then the value of the clock frequency is output as the preferred clock frequency of operation. It should be noted that in this case the clock frequency is started low and gradually increased until a certain number of transitions that are the number that can be tolerated for these operating conditions are detected.

Figure 9:
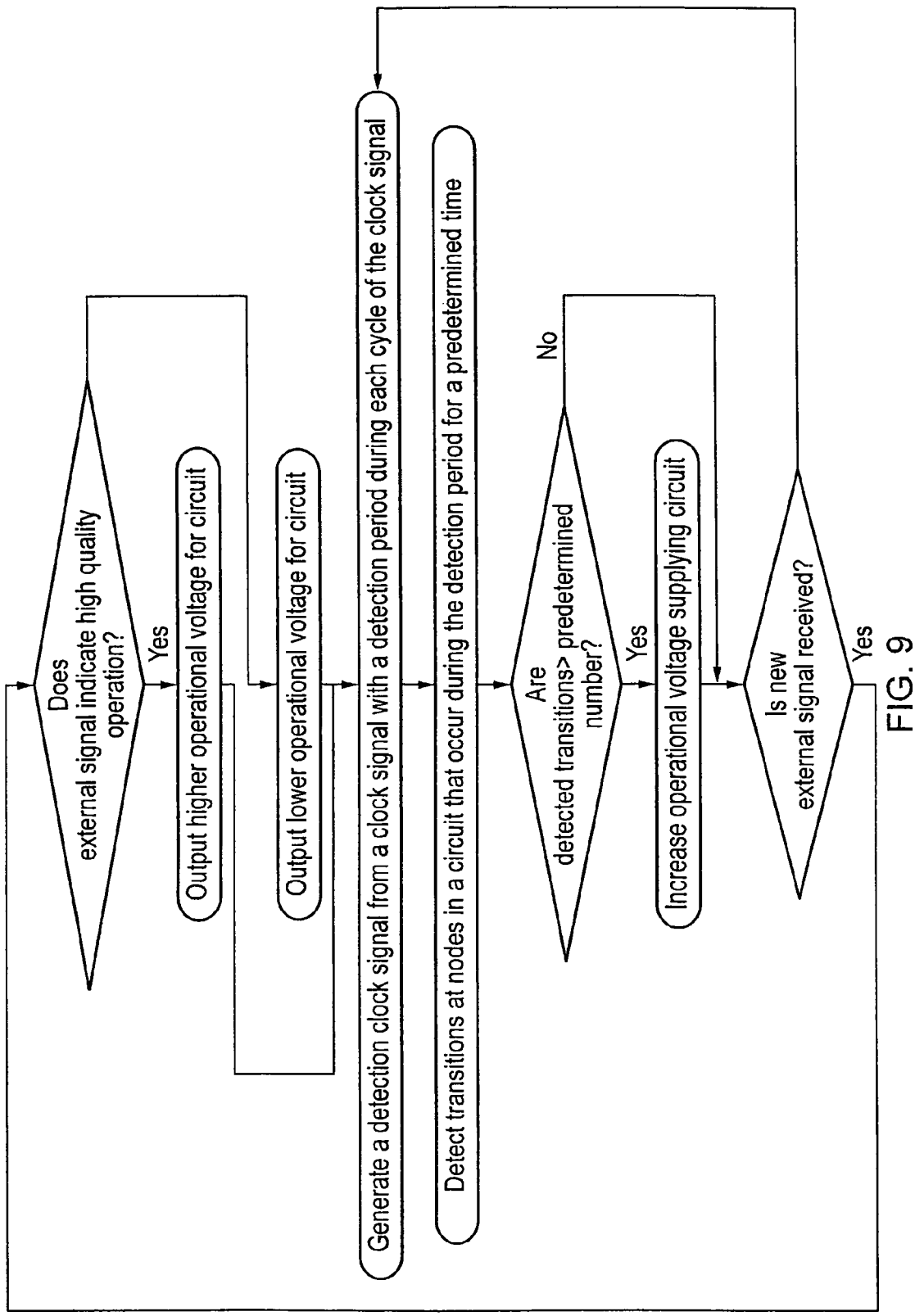
FIG. 9 shows a control method for controlling the operational voltage of a circuit by detecting transitions according to an embodiment of the present invention.

Another method of detecting slack in a system and altering the operating conditions according to both slack detected and the required mode of operation is illustrated in FIG. 9. In this method, the system is responsive to the mode of operation of an external system which the circuit being monitored is part of. This external system may for example be a video system which has a high quality mode in which high quality video images are required and a lower quality, low power mode where lower quality pictures are allowed. Thus, initially the external signal is monitored to determine whether high quality operation is required. If it is, then a higher operating voltage is supplied to the circuit whereas if high quality mode is not required then a lower operating voltage is output. The detection clock signal is then generated and transitions are detected at a number of nodes in the circuit within the detection period. It is then determined if there are more transitions detected than a predetermined number. The value of this predetermined number depends on the mode of operation, a higher value being allowed for the low quality mode of operation. If there are more transitions than this predetermined number then the operational voltage is increased.

The system then detects to see whether another external signal has been received and if not it carries on generating the clock signal and detecting transition and increasing the operational voltage if required. If a new external signal is received then the initial higher or lower operation voltage is supplied to the circuit and the process is repeated.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Transition detection circuitry for detecting during multiple clock cycles, transitions occurring within a detection period in each of said multiple clock cycles at a plurality of nodes within a circuit, said transition detection circuitry comprising:

a clock signal generator for generating a detection clock signal from a clock signal clocking a sampling element within said circuit, said detection clock signal defining said detection period, wherein said sampling element comprises a latch;

a plurality of transition detectors for detecting transitions at respective ones of said plurality of nodes during said detection period, each of said plurality of transition detectors being clocked by said detection clock signal;

combining circuitry for combining said detected transitions output by said plurality of transition detectors to generate a composite transition detection signal.

2. Transition detection circuitry according to claim 1, wherein said clock signal generator generates said detection clock signal by inverting said clock signal clocking said sampling element and delaying an edge initiating said detection period.

3. Transition detection circuitry according to claim 2, wherein said clock signal generator generates said detection clock signal by delaying said clock signal by an amount such that a time delay from said detection clock signal transitioning to start said detection period and a subsequent transition of said clock signal is greater than a time taken for a signal from any of said plurality of nodes to reach said sampling element.

4. Transition detection circuitry according to claim 1, wherein said plurality of nodes are located upstream from said sampling element by at least one combinational logic element.

5. Transition detection circuitry according to claim 1, said transition detection circuitry further comprising control circuitry, said control circuitry being responsive to said composite transition detection signal to control one or more operational parameters of said circuit, said one or more operational parameters including one or more of an operating voltage and an operating frequency.

6. Transition detection circuitry according to claim 5, wherein said control circuitry is responsive to said composite transition detection signal indicating more detected transitions than a predetermined value to perform at least one of the following steps:
 increase said operating voltage and decrease said operating frequency.

7. Transition detection circuitry according to claim 1, said transition detection circuitry further comprising control circuitry, said control circuitry being configured to control said clock signal generator to change said detection clock signal such that said detection period occurs at a different time within said clock cycle in response to detection of an externally set control parameter.

8. Transition detection circuitry according to claim 1, said transition detection circuitry further comprising control circuitry, said control circuitry being configured to periodically turn said clock signal generator off, such that said detection clock signal is generated intermittently.

9. Transition detection circuitry according to claim 8, wherein said control circuitry is responsive to said transition detection circuitry detecting fewer than a predetermined number of transitions within a predetermined time to turn said clock signal generator off.

10. Transition detection circuitry according to claim 9, wherein said clock signal generator is turned off with said clock signal having a value such that said transition detectors continue to detect transitions, said control circuitry being responsive to detection of a transition by one of said transition detectors to turn said clock signal generator on.

11. Transition detection circuitry according to claim 1, wherein said combining circuitry combines said detected transitions to generate a binary signal indicating a detection of at least one transition or a detection of no transitions.

12. Transition detection circuitry according to claim 1, wherein said combining circuitry combines said detected transitions to generate a signal indicative of a number of transitions occurring within a predetermined time.

13. Transition detection circuitry according to claim 1, wherein said clock signal generator is configured to generate a plurality of detection clock signals from a clock signal clocking said sampling element, each of said detection clock signals defining a different detection period within said clock cycle; and
 wherein said plurality of transition detectors are for detecting transitions at respective ones of said plurality of nodes of said circuit, said plurality of nodes being arranged at different points within said circuit and at different distances from said sampling element, said nodes being arranged in sets corresponding to their distance from said sampling element, each set comprising nodes at a similar distance from said sampling element, at least some of said transition detectors being clocked by a different one of said detection clock signals; and
 said combining circuitry is configured to combine detected transitions output by transition detectors detecting transitions at each set of nodes, such that a combined transition detection signal is generated for each set of nodes.

14. Transition detection circuitry according to claim 1, wherein said circuit comprises a plurality of sampling elements with combinational logic between said sampling elements, and wherein
 said plurality of transition detectors are for detecting transitions at respective ones of said plurality of nodes of said circuit, said plurality of nodes being arranged at different points within said circuit between different sampling elements, said nodes being arranged in sets corresponding to said sampling elements that they are between;
 said combining circuitry being configured to combine said detected transitions output by a plurality of transition detectors detecting transitions at each set of nodes to generate a plurality of composite transition detection signals corresponding to said set of nodes.

15. Transition detection circuitry according to claim 1, wherein at least some of said transition detectors are configured to detect transitions from a first logic level to a second logic level and not to detect transitions from said second logic level to said first logic level.

16. Transition detection circuitry according to claim 1, wherein at least one of said plurality of transition detectors is configured to detect transitions occurring between a first logic level and a second logic level and said combination circuit element is configured to propagate transitions occurring between closer logic levels than said first and second logic levels, such that some transitions that are propagated by said combination circuit element are not detected by said at least one transition detector.

17. Analytical circuitry for analysing a circuit and determining preferred operating conditions of said circuit comprising:
 transition detection circuitry for detecting during multiple clock cycles, transitions occurring within a detection period in each of said multiple clock cycles at a plurality of nodes within said circuit, said transition detection circuitry comprising:
 a clock signal generator for generating a detection clock signal from a clock signal clocking a sampling element within said circuit, said detection clock signal defining said detection period;
 a plurality of transition detectors for detecting transitions at respective ones of said plurality of nodes during said detection period, each of said plurality of transition detectors being clocked by said detection clock signal;

combining circuitry for combining said detected transitions output by said plurality of transition detectors to generate a composite transition detection signal;

said analytical circuitry further comprising:

control circuitry for controlling at least one of said operational voltage of said circuit and said clock frequency clocking said sampling element; and analyzing circuitry for analyzing said composite transition detection signals output and for determining a preferred value for at least one of said operational voltage and said clock frequency.

18. A method of detecting, during multiple clock cycles, transitions occurring within a detection period during each of said multiple clock cycles at a plurality of nodes within a circuit comprising sampling elements clocked by a clock outputting said multiple clock cycles, said method comprising the steps of:

generating a detection clock signal from a clock signal clocking a sampling element comprising a latch within said circuit, said detection clock signal defining said detection period:

detecting transitions at respective ones of said plurality of nodes during said detection period;

combining said detected transitions to generate a composite transition detection signal.

19. A method of controlling at least one of an operating frequency and an operating voltage of a circuit, comprising detecting transitions occurring at nodes within said circuit using a method according to claim 18; and altering at least one of said operating voltage and operating frequency of said circuit in response to said composite transition detection signal.

20. Transition detection circuitry for detecting during multiple clock cycles, transitions occurring within a detection period in each of said multiple clock cycles at a plurality of nodes within a circuit, said transition detection circuitry comprising:

a clock signal generator for generating a detection clock signal from a clock signal clocking a sampling element within said circuit, said detection clock signal defining said detection period;

a plurality of transition detectors for detecting transitions at respective ones of said plurality of nodes during said detection period, each of said plurality of transition detectors being clocked by said detection clock signal;

combining circuitry for combining said detected transitions output by said plurality of transition detectors to generate a composite transition detection signal, said transition detection circuitry further comprising control circuitry, said control circuitry being configured to periodically turn said clock signal generator off, such that said detection clock signal is generated intermittently.

21. Transition detection circuitry according to claim 20, wherein said control circuitry is responsive to said transition detection circuitry detecting fewer than a predetermined number of transitions within a predetermined time to turn said clock signal generator off, and wherein said clock signal generator is turned off with said clock signal having a value such that said transition detectors continue to detect transitions, said control circuitry being responsive to detection of a transition by one of said transition detectors to turn said clock signal generator on.

* * * * *